United States Patent [19]
Klinedinst et al.

[11] Patent Number: 5,352,487
[45] Date of Patent: Oct. 4, 1994

[54] PROCESS FOR THE FORMATION OF SIO$_2$ FILMS

[75] Inventors: Keith A. Klinedinst, Marlborough; Joseph E. Lester, Lincoln, both of Mass.

[73] Assignee: GTE Products Corporation, Danvers, Mass.

[21] Appl. No.: 938,088

[22] Filed: Aug. 31, 1992

[51] Int. Cl.$^5$ .................................. C23C 16/00
[52] U.S. Cl. .................... 427/248.1; 427/585
[58] Field of Search .................. 427/248.1, 585; 118/719, 715

[56] References Cited

U.S. PATENT DOCUMENTS

| | | | |
|---|---|---|---|
| 4,526,805 | 7/1985 | Yoshizawa | 118/719 |
| 4,597,985 | 7/1986 | Chandross et al. | 427/39 |
| 4,689,093 | 8/1987 | Ishihara et al. | 427/585 |
| 4,702,934 | 10/1987 | Ishihara et al. | 118/719 |
| 4,708,884 | 11/1987 | Chandross et al. | 427/39 |
| 4,716,852 | 1/1988 | Tsujii et al. | 118/715 |
| 4,902,934 | 2/1990 | Miyamura et al. | 118/719 |
| 4,949,005 | 8/1990 | Parham et al. | 313/112 |
| 5,024,182 | 6/1991 | Kobayashi et al. | 118/715 |
| 5,081,069 | 1/1992 | Parker et al. | 427/248.1 |
| 5,126,169 | 6/1992 | Ishihara et al. | 427/248.1 |
| 5,154,943 | 10/1992 | Etzkorn et al. | 427/248.1 |

FOREIGN PATENT DOCUMENTS

409544A2  1/1991  European Pat. Off. .

OTHER PUBLICATIONS

G. Smolinski et al., "Measurements of Temperature Dependent Stress of Silicon Oxide Films . . . ," *J. Electrochem Soc.: Solid State Sci. & Techn.* (Apr. 1985) pp. 950–954.

Masanori Okuyama et al., "Preparation and Basic Properties of PhTiO$_3$ Ferroelectric Thin Films and Their Device Applications," *Ferroelectrics*, 63, pp. 243–252 (1985). (no mo.).

G. Smolinski et al., LPCVD of Silicon Oxide Films in the Temperature Range 410° to 600° C. from Diacetoxyditertiarybutoxysilane, *Mat. Lett.*, 4 [5, 6, 7] pp. 256–260 (Jul. 1986).

R. A. Levy et al., "A New LPCVD Technique of Producing Borophosphosilicate Glass Films . . . ," *J. Electrochem Soc.: Solid State Sci. & Tech.* (Feb. 1987) pp. 430–437.

R. A. Levy et al., "Low Pressure Chemical Vapor Deposition of Borophosphosilicate Glass Films . . . ," *J. Electrochem Soc.: Solid-State Sci. & Techn.* (Jul. 1987) pp. 1744–1749.

Y. He et al., "Three Dimensional Mathematical Modeling of Transport Processes in CVD Reactors," *Proc. 10th Internat. Conf. CVD, 1987*, pp. 193–203, (no mo.).

G. Smolinski, "LPCVD of SiO$_2$ Films Using the New Source Material DADBS," *Proc. 10th Internat. Conf. CVD, 1987*, pp. 490–496. (no mo.).

K. F. Roenigk et al., "Low Pressure CVD of Silicon Nitride," *J. Electrochem. Soc.: Solid-State Science & Technology*, 134 [7] pp. 1777–1785 (Jul. 1987).

R. C. Rossi, "Low Pressure [CVD], " *Handbook of Thin-Film Deposition Processes and Techniques*, K. K. Schuegraf, Ed., Noyes Publns., Park Ridge, N.J., 1988, pp. 80, 106. (no mo.).

G. Lucovsky et al., "Formation of Inorganic Films . . . Plama Enhanced [CVD], " *Thin Film Processes II*, J. L. Vossen et al., Eds., Academic Press, NY, 1991, pp. 565–619. (no mo.).

R. Hofman et al., "The Pyrolytic Decomposition of . . . (DADBS) During Chemical Vapour Deposition of Thin Oxide Films," Abstract (Paper cancelled), MRS Meeting, Boston, Dec. 1991.

*Primary Examiner*—Janyce Bell
*Attorney, Agent, or Firm*—Frances P. Craig; Robert F. Clark

[57] ABSTRACT

An apparatus and method for the low temperature deposition of SiO$_2$ in a low pressure chemical vapor deposition system is disclosed. The apparatus makes use of a prereactor to form an activated form of diacetoxyditertiarybutoxysilane (DADBS) from which SiO$_2$ is deposited. The prereactor may be positioned upstream of an SiO$_2$ deposition reactor or may be incorporated into the front end thereof.

1 Claim, 8 Drawing Sheets

PROCESS FOR THE FORMATION OF SIO₂ FILMS

FIELD OF THE INVENTION

The invention relates to processes for the deposition of $SiO_2$ thin films at relatively low temperatures via low pressure chemical vapor deposition.

BACKGROUND OF THE INVENTION

Silicon oxide films prepared by low pressure chemical vapor deposition (LPCVD) are used in the fabrication of integrated circuits and also in the fabrication of multi-layer optical filters. It is often desirable and necessary to form such deposits at relatively low temperatures, either to avoid damaging thermally sensitive structures already present on the deposition substrate or because of process temperature constraints imposed by the need to deposit efficiently one or more materials within the same reactor environment. This latter case is particularly relevant during the deposition of multi-layer optical filters. In this context, process temperatures below approximately 500° C. and, more typically, below approximately 450° C. are considered to be low temperature.

One approach to achieving low deposition temperatures has been to employ non-thermal chemical activation means to cause various gas-phase deposition precursors to react at lower temperatures than would otherwise be the case. Examples of this approach include so-called plasma-enhanced chemical vapor deposition (PECVD), and photo-assisted chemical vapor deposition (PACVD) in which an exposure to a glow discharge or high energy electromagnetic radiation are employed as the activating means either prior to the deposition or simultaneously with the deposition.

Yet another approach involves the use of chemical vapor deposition precursors which thermally decompose to $SiO_2$ at lower temperatures than do more commonly used precursors such as tetraethyl-orthosilicate (TEOS). Included in the class of low temperature deposition precursors are alkylsilanes and alkoxysilanes. In particular, the use of the alkoxysilane diacetoxyditertiary-butoxysilane (DADBS) as a low temperature chemical vapor deposition precursor has been the subject of much study in recent years. Despite extensive research, low temperature $SiO_2$ deposition from DADBS is unacceptably slow, typically being on the order of approximately 10–20 Å per minute in an LPCVD reactor operating at approximately 450° C.

Thus, a need exists for a method to substantially enhance the low temperature deposition rate of $SiO_2$ from DADBS. Furthermore, a need exists for an enhanced deposition method that may achieve satisfactory deposition rates without the use of plasma, photon, or any other extraordinary activation techniques which increases both the cost and complexity of the overall process.

OBJECTS AND SUMMARY OF THE INVENTION

It is one object of the present invention to provide an improved apparatus and method for the low temperature deposition of $SiO_2$ in a low pressure chemical vapor deposition apparatus.

It is another object of the present invention to provide an apparatus and method for the deposition of $SiO_2$ from DADBS in which the effective activation energy for the process is significantly lowered.

It is yet another object of the present invention to provide an apparatus for the low temperature deposition of $SiO_2$ from DADBS in which a DADBS prereactor is employed.

It is a further object of the present invention to provide an apparatus for the low temperature deposition of $SiO_2$ from DADBS in which DADBS prereactor is integrated into a deposition reactor as a unitary system.

It is still another object of the present invention to provide a system for the deposition of $SiO_2$ from DADBS that is relatively insensitive to minor temperature non-uniformities and fluctuations during the deposition process.

It is yet another object of the present invention to provide a system for enhancing the rate of deposition of $SiO_2$ from DADBS in a low pressure chemical vapor deposition process.

The present invention relates to the discovery that low pressure chemical vapor deposition of $SiO_2$ from DADBS can be enhanced by use of a prereactor system. More particularly, the invention relates to the discovery that the deposition of $SiO_2$ from DADBS may be enhanced by heating DADBS to a temperature higher than the deposition temperature to increase the formation of activated DADBS from which the $SiO_2$ is deposited.

The deposition system may comprise either a gas-phase prereactor positioned upstream of a gas-phase deposition reactor, or as an alternative, the system may comprise a single two-stage reactor having a first prereactor section in which DADBS is converted to its activated form, and a second, lower temperature section in which the activated DADBS is caused to deposit upon a substrate.

The invention also pertains to a deposition process in which DADBS is optionally mixed with an inert diluent and heated, in a prereactor, to a first temperature to convert a fraction of the DADBS molecules to an activated species, thereby forming a mixture of unactivated DADBS, activated DADBS and the optional diluent. The mixture is then flowed into a deposition reactor which is maintained at a lower temperature than that in which the DADBS molecules were activated, and optionally mixed with another diluent or oxidant gas. Once in the deposition reactor, the mixture is allowed to deposit upon at least one substrate contained within the deposition reactor.

Finally, the invention pertains to a system and method in which temperature non-uniformities or fluctuations in either the DADBS prereactor or the deposition reactor have a substantially lesser effect than in the case of a single deposition reactor operating in the absence of a DADBS prereactor.

Other objects and details of the present invention will become apparent from the attached drawings and detailed description.

DETAILED DESCRIPTION OF THE DRAWINGS

FIGS. 1–4, 7 and 8 plot which demonstrate the advantages of the present invention.

Figure 1:
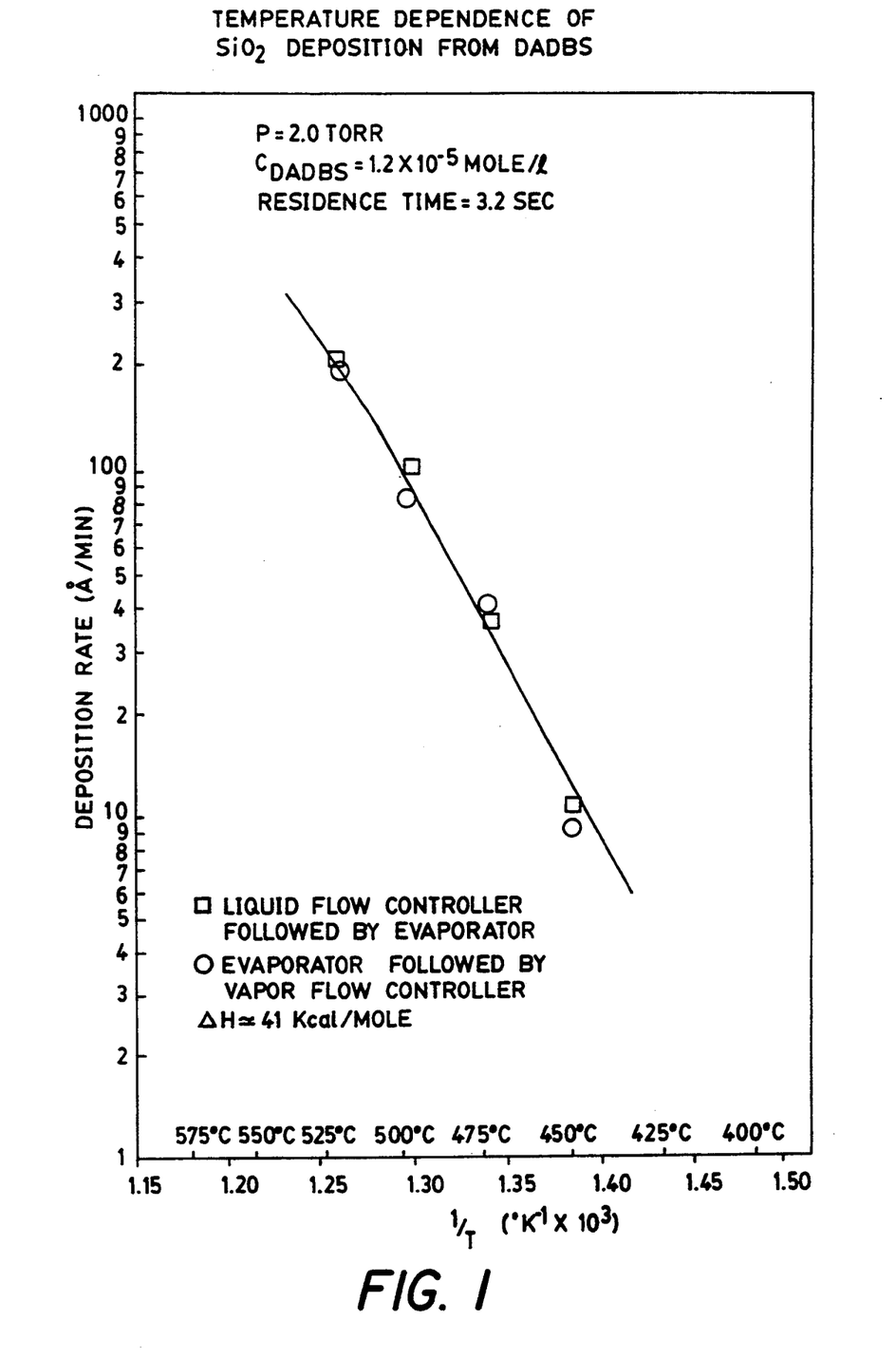
FIG. 1 is an Arrhenius plot for the deposition of $SiO_2$ by the thermal decomposition of DADBS in an LPCVD reactor.

FIG. 1 depicts the Arrhenius plot (log rate versus reciprocal temperature) for the deposition of SiO$_2$ via the thermal decomposition of DADBS in a hot-wall LPCVD reactor. During the deposition process, the reactor pressure was maintained at 2 torr, the inlet gas-phase DADBS concentration was $1.2 \times 10^{-5}$ mole/liter, and the gas velocity was approximately 19 cm per second, corresponding to a 3.2 second residence time for precursor within a 24 inch long hot zone of a 4" diameter vertical LPCVD reactor. Based upon the resulting plot, the apparent activation energy for the process (the negative of the slope multiplied by the gas constant) is a relatively high 41 kcal/mole, making the rate of the deposition process relatively sensitive to deviations from the temperature setpoint, temperature non-uniformities, and minor fluctuations in the temperature of the deposition reactor. Deposition rates have been found to vary from between approximately 10 to 100 Å per minutes as the process temperatures are increased in the range between 450° and 500° C.

Figure 2:
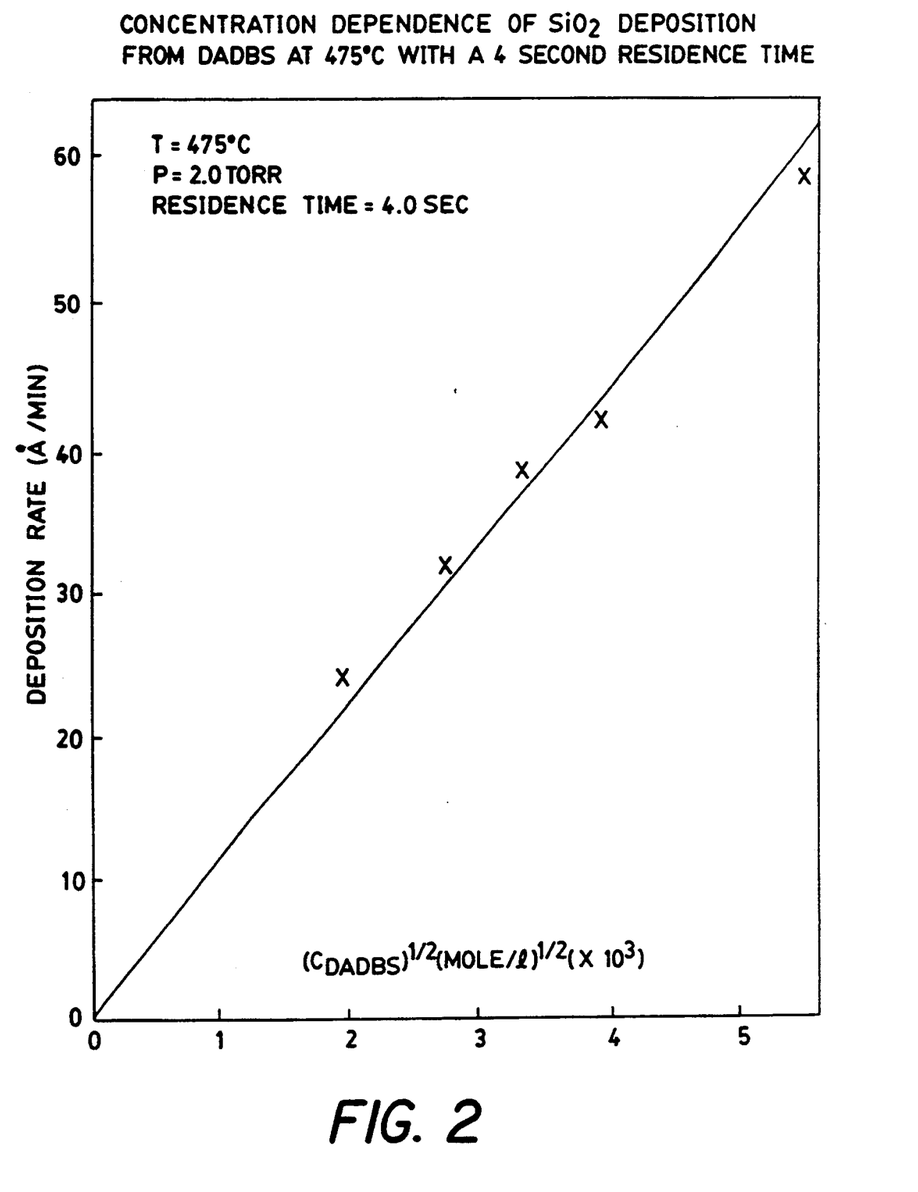
FIG. 2 is a plot of the $SiO_2$ deposition rate from 475° C. DADBS as a function of the square root of DADBS concentration.

FIG. 2 is a plot of the SiO$_2$ deposition rate from DADBS at 475° C. as a function of the square root of the nominal concentration of DADBS within the LPCVD reactor for a constant of DADBS residence time. As can be seen, the rate of the SiO$_2$ deposition is basically a linear function of the square root of the nominal gas-phase DADBS concentration.

Figure 3:
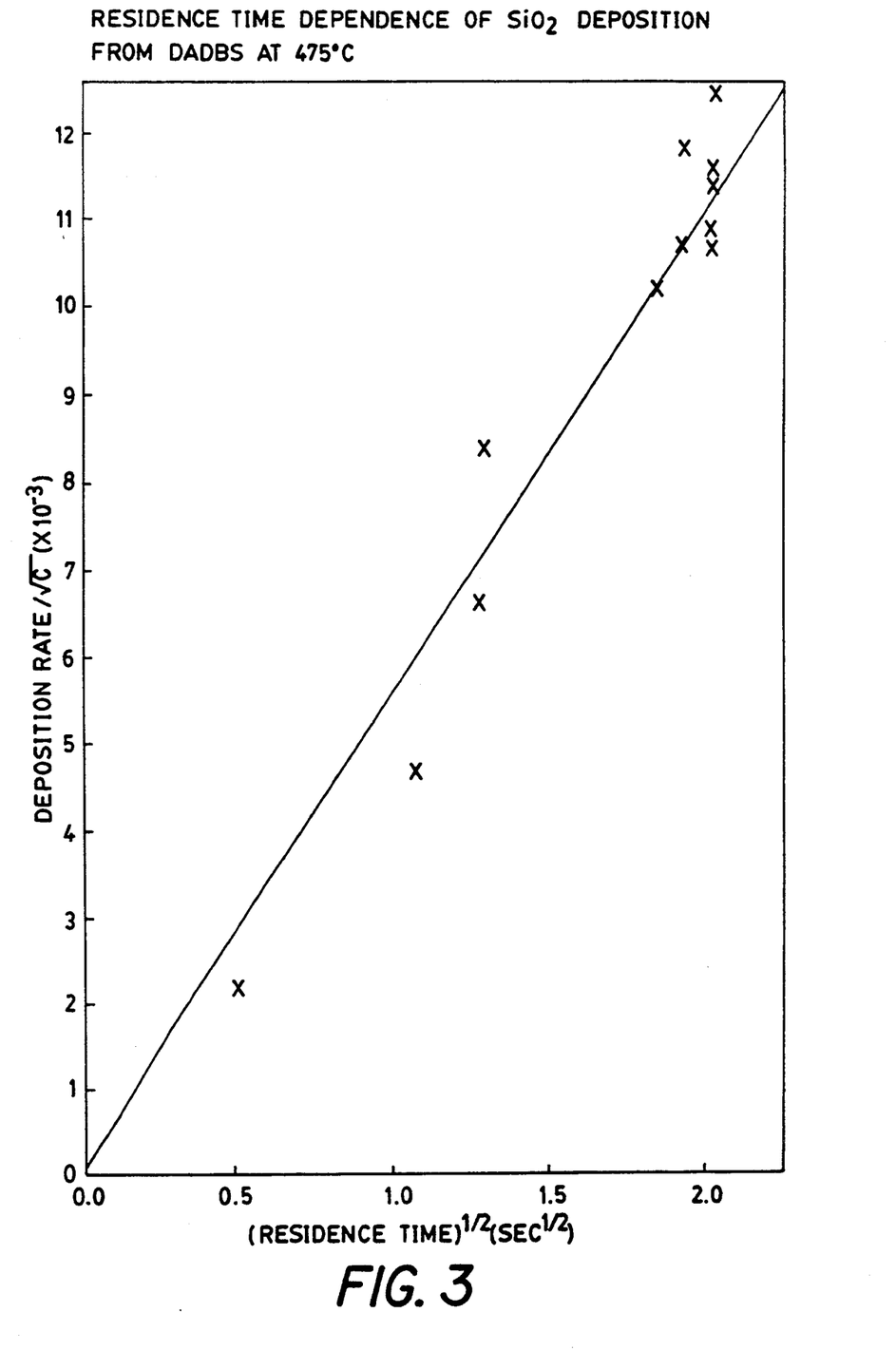
FIG. 3 is a plot of the SiO$_2$ deposition rate normalized by the square root of the DADBS concentration versus the square root of the DADBS residence time.

FIG. 3 is a plot of the SiO$_2$ deposition rate divided by the square root of the nominal DADBS concentration versus the square root of the DADBS residence time for a different series of coating runs at 475° C. As can be seen, the deposition rate, normalized by the square root of the DADBS concentration, also increase linearly with the square root DADBS residence time. The combined concentration and residence time dependencies are demonstrated in FIG. 4 where the SiO$_2$ deposition rate is plotted against the square root of the concentration-residence time product for experiments carried out at 450°, 475°, and 500° C.

Figure 4:
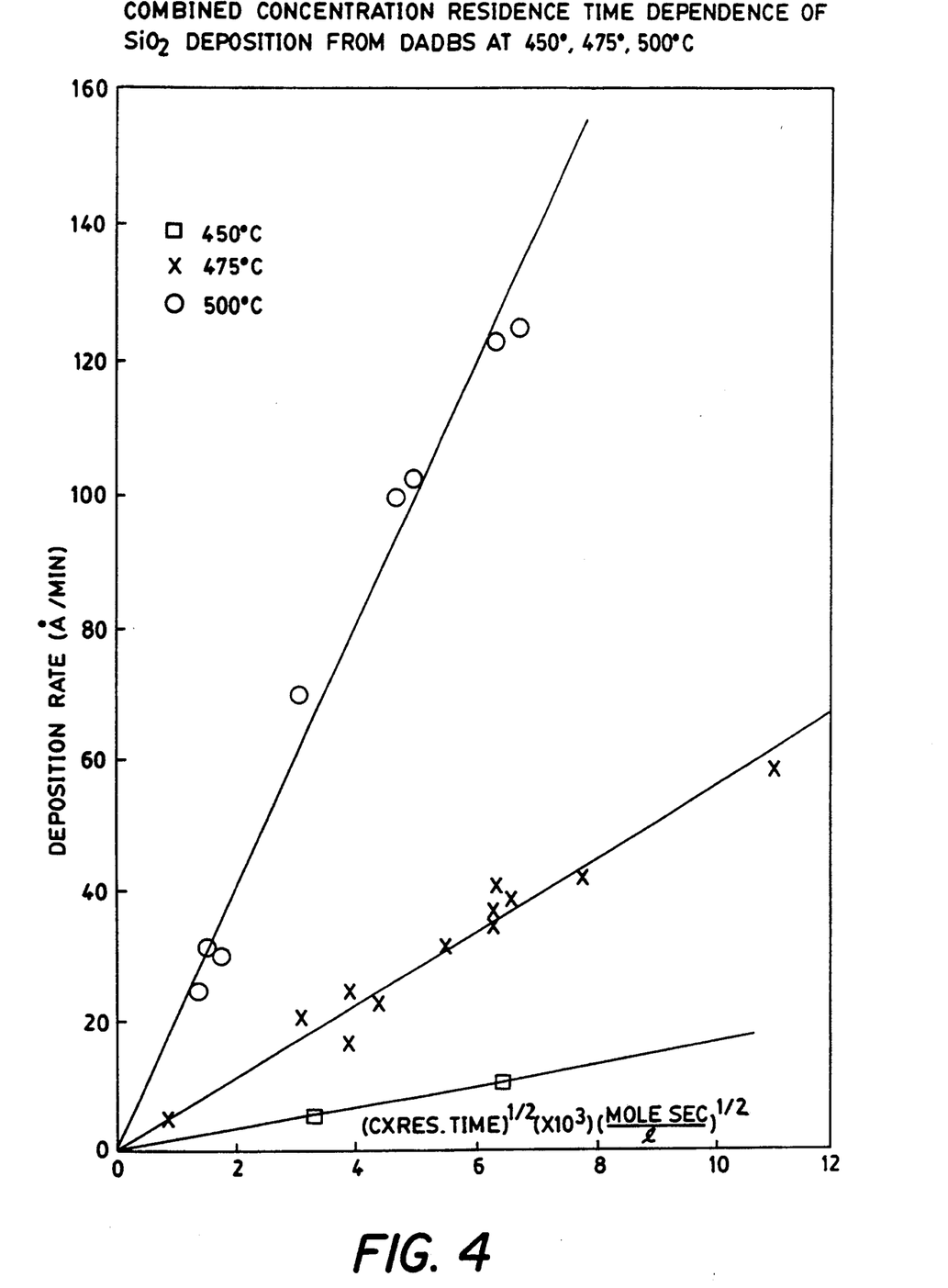
FIG. 4 is a plot of the SiO$_2$ deposition rate versus the square root of the product of concentration and residence time at various temperatures.

The marked residence time dependency strongly suggests that it is not DADBS itself which adsorbs and reacts upon the coating substrate but, rather, a species formed in the gas-phase, (within the hot-wall reactor), via the thermal decomposition of DADBS. This suggests that, if the gas-phase reaction forming this reactive intermediate proceeds at a relatively slow rate at the reactor temperature, then the rate of its formation may limit the rate of the overall SiO$_2$ deposition reaction.

Although the mechanism for the deposition of SiO$_2$ from DADBS is not known, it is believed that the DADBS must first be converted to an activated intermediate (designated DADBS*) prior to absorbing Accordingly, one aspect of the present invention is the discovery that if the rate of formation of the reactive intermediate can be substantially increased, then the rate of SiO$_2$ deposition at a given substrate temperature may also be substantially increased. The present invention also demonstrates a means by which it is possible to substantially increase the rate of SiO$_2$ deposition from DADBS within an LPCVD reactor at temperatures on the order of approximately 450° C.

Figure 5:
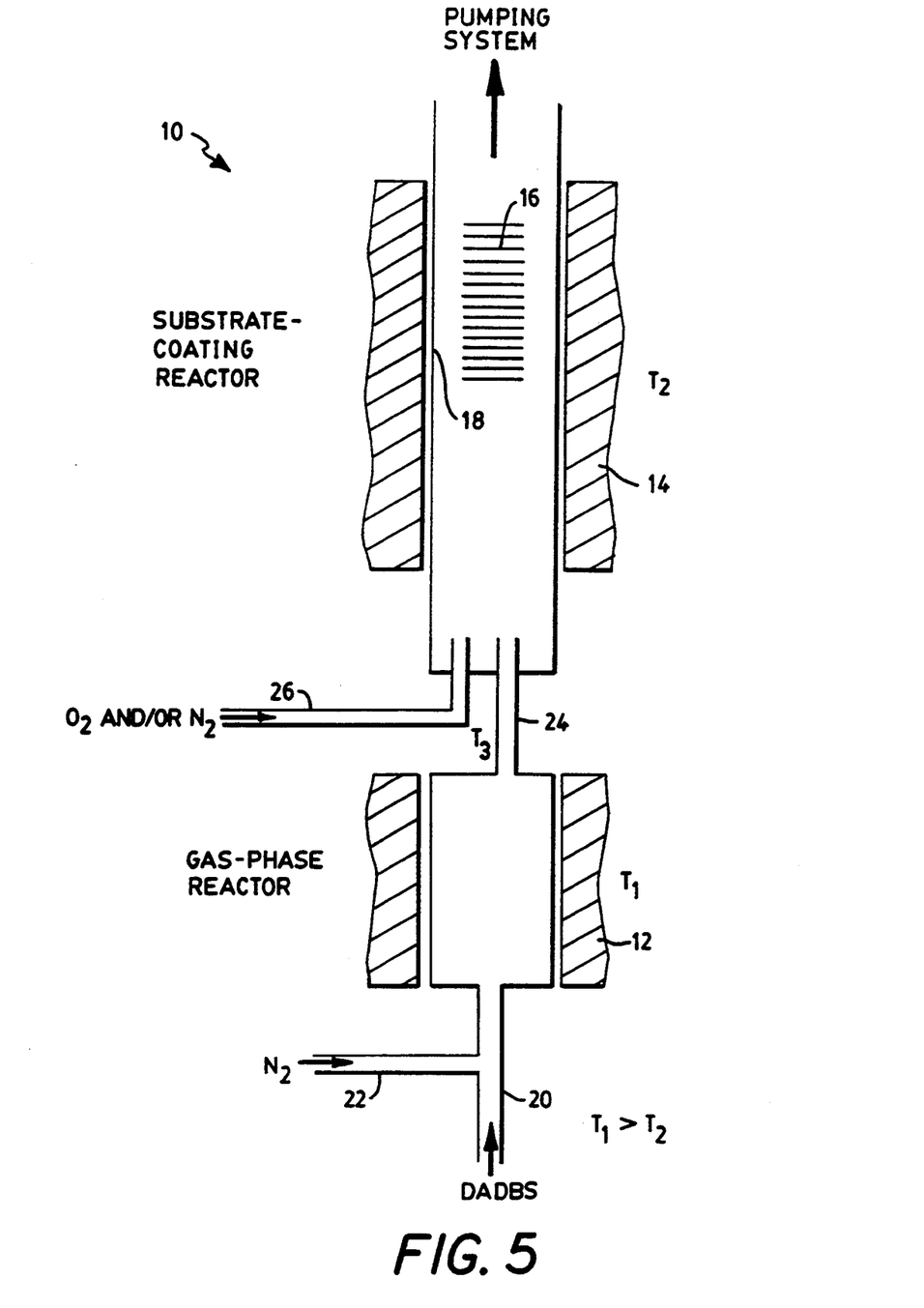
FIG. 5 is a schematic representation of an SiO$_2$ deposition apparatus having a separate DADBS prereactor.

In a first embodiment the present invention, instead of a single LPCVD film-deposition reactor, two reactors, connected in series, are employed. A schematic representation of such a configuration is depicted in FIG. 5.

Specifically, the coating system 10 comprises a gas-phase prereactor 12 in which DADBS is converted to DADBS*. The prereactor 12 is a hot-wall reactor operated at a first temperature, $T_1$ between 450° C. to 550° C. A thin-film deposition reactor 14 is connected in series to the prereactor 12 and comprises a second hot-wall reactor operated at a second temperature, $T_2$ between 450° C., that is lower than the temperature in the prereactor 12. The temperature of each reactor may be controlled individually or, in the alternative, by a single temperature controlling system.

As an alternative, the deposition reactor 14 may be designed in a manner such that only the deposition substrates 16 are heated to the deposition temperature $T_2$. In that case the reactor walls 18 are preferably maintained at a substantially lower temperature.

During an SiO$_2$ deposition, the unactivated precursor DADBS flows into the prereactor 12 via a precursor feed line 20. Optionally, the DADBS may be mixed with an inert diluent, such as nitrogen, via a diluent feed line 22. The DADBS flow rate is controlled by an upstream mass flow controller (not shown), and the pressure controlled by a throttle valve downstream of the deposition reactor and upstream of the vacuum pump.

While in the prereactor 12, a fraction of the DADBS molecules are converted to the DADBS* species. The conversion rate is controlled by the prereactor temperature $T_1$ as well as by the pressure, the DADBS concentration, and the average residence time within the prereactor 12. The mixture of activated and unactivated DADBS molecules (along with any gaseous product or inert diluent that might have been added to the gas stream) exits the prereactor 12 and flows through a section of connecting tubing (i.e., a fluid conduit) 24, that is preferably maintained, via a temperature controller, at a temperature $T_3$ which is lower than that maintained within the deposition reactor 14. In a most preferred embodiment, the temperature $T_3$ of the conduit is maintained at a level (approximately 350° C.) that is high enough to prevent the reactant mixture from adsorbing in the conduit walls, and low enough to prevent the SiO$_2$ formation reaction within the conduit.

Upon entering the deposition reactor 14 the DADBS mixture may be mixed with an oxidant gas or further diluted with nitrogen or another inert gas prior to contacting the deposition substrates. The oxidant or diluent gas enters the deposition reactor 14 via a gas line 26.

During deposition, substrates 16 upon which deposition is to occur are maintained at the deposition temperature $T_2$. $T_2$ is preferably at least about 50° C. lower than the prereactor temperature $T_1$.

By analogy with plasma-enhanced processes in which a glow discharge is employed to provide the energy required to activate the precursor species, this new method is referred to herein as remote thermally enhanced CVD (RTECVD).

Figure 6:
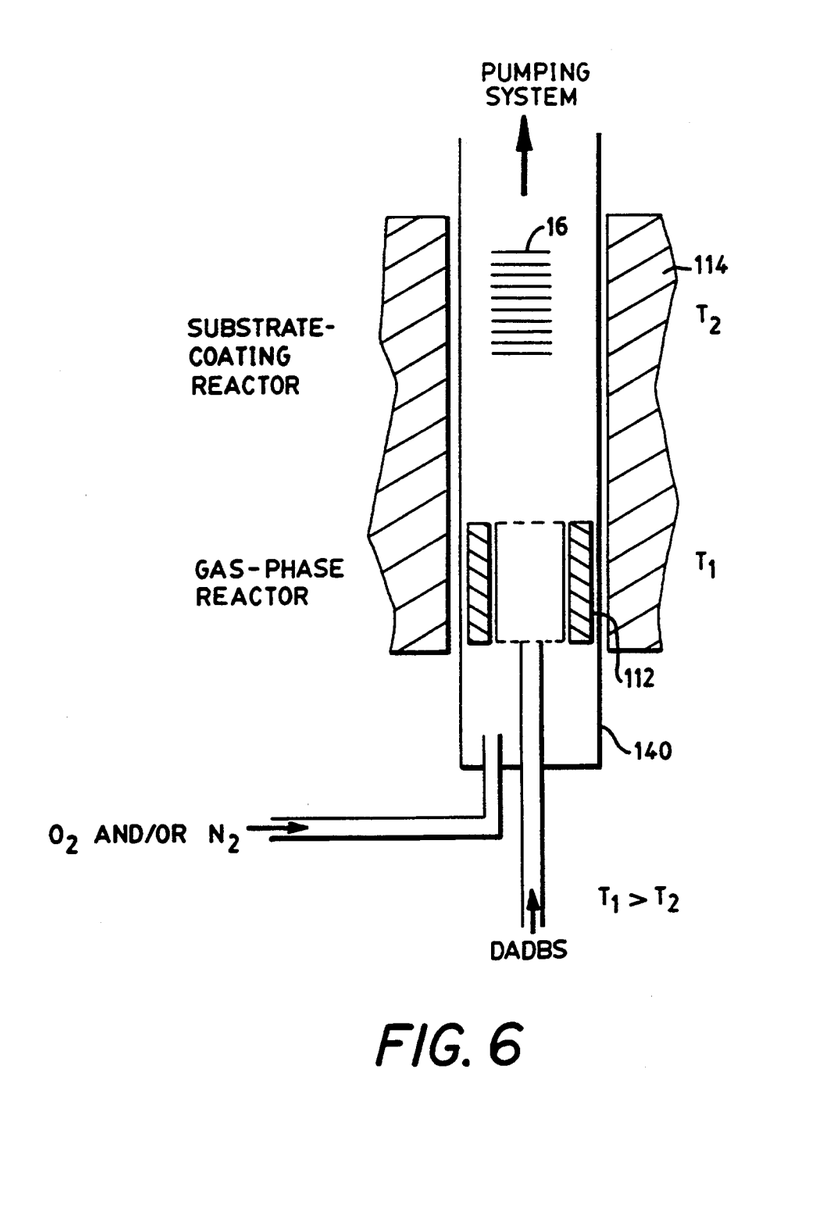
FIG. 6 is a schematic representation of a second embodiment of an SiO$_2$ deposition system having a DADBS prereactor incorporated into the inlet section of a deposition reactor.

If the diameter of the heated tubing 24 connecting the gas-phase prereactor with the deposition reactor is increased, it may reach the diameter of the prereactor or of the deposition reactor itself. Such a configuration is depicted schematically in FIG. 6, representing a second embodiment of the invention, in which the high temperature gas-phase prereactor 112 and the lower temperature deposition reactor 114 are conceptually integrated into a single unit within a single elongated section of quartz tubing 140. This limiting situation, in which two different reactors are integrated within a singular tubular envelope, may be distinguished from cases in which, for various reasons, non-uniform temperature profiles are deliberately established within a single LPCVD reactor, such as for example, the case in which the deposition reactor is designed to have a temperature gradient, increasing downstream, to provide a uniform $SiO_2$ deposition rate as the reactant concentration decreases.

EXAMPLES

The following examples are offered to illustrate and further define the invention. In each of the examples, the thin-film deposition reactor consisted of a vertical 4 inch O.D. quartz tube connected via o-ring compression seals to a stainless steel base plate on the bottom end and to a stainless steel vacuum line at the top. Heated gas-delivery lines were welded into the base plate. The stainless steel vacuum line led to a diaphram-type pressure transducer, a liquid-nitrogen cold trap, a butterfly-type pressure control valve, a particle trap, and a vacuum pump equipped with a Roots blower. A four-zone furnace was employed to establish a long constant-temperature zone within the deposition reactor with the deposition substrates (each being a 2 inch diameter wafer) positioned such that the last is at the upper end of the constant temperature zone.

Example 1

In this example, the reactor configuration was essentially that diagramed in FIG. 5 with the gas-phase prereactor and thin-film deposition reactor connected via a section of heated 0.5 inch diameter stainless steel tubing. The prereactor was fabricated from a 6 inch long section of 2 inch diameter stainless steel tubing with welded end plates and a thermostatically controlled external resistance heater.

Vacuum-distilled DADBS was vaporized within an evacuated stainless steel container heated to approximately 105° C. The vaporized DADBS precursor flowed through heated lines into the prereactor at a rate of approximately 14 sccm. The flow rate was controlled via an MKS high temperature mass flow controller heated to approximately 150° C. The gas exiting the prereactor was diluted with purified $N_2$ which flowed into the base of the deposition reactor at a controlled rate of approximately 40 sccm. The deposition reactor temperature and pressure were maintained at approximately 450° C. and 1000 mtorr, respectively. Separate depositional experiments were carried out with the prereactor temperature controlled at 150°, 300°, 450°, and 550° C. The thickness of the $SiO_2$ films deposited in each experiment were determined ellipsometrically.

The results of each run are compared in Table I.

TABLE I

Rate of $SiO_2$ Deposition from DADBS at 450° versus Prereactor Temperature
Nominal DADBS Concentration in Reactor: 5.7 μmole/l
Gas Velocity in Reactor: 28 cm/sec

| Prereactor Conditions | | |
|---|---|---|
| T(°C.) | Res. Time (sec) | DADBS Conc. (mole/l) |
| 150 | 1.1 | $3.8 \times 10^{-5}$ |
| 300 | 0.81 | $2.8 \times 10^{-5}$ |
| 450 | 0.64 | $2.2 \times 10^{-5}$ |
| 550 | 0.56 | $1.9 \times 10^{-5}$ |

| Deposition Results Dep. Rate On 3 Mid Substrates (Å/min) | | |
|---|---|---|
| Center −1 | Center | Center +1 |
| 9.1 | 10.2 | 11.2 |
| 9.0 | 10.5 | 11.4 |
| 10.4 | 11.3 | 12.1 |
| 44.8 | 44.8 | 44.3 |

Listed in the table are the prereactor temperature, DADBS concentration within the prereactor (calculated assuming a 1000 mtorr gas pressure within the prereactor), and the approximate residence time, along with the $SiO_2$ deposition rates (in Angstroms per minute) measured on three silicon wafers, (spaced approximately 5 cm apart and selected from the relative center of a stack of such wafers in the reactor). As can be seen in Table I, an approximate 10 Å per minute deposition rate was obtained when the system was operated while maintaining prereactor temperatures lower than the deposition reactor temperature. Slightly higher deposition rates resulted when both the prereactor and the deposition reactor were maintained at the same 450° C. temperature. However, when the prereactor was operated at a temperature approximately 100° C. above the deposition reactor temperature, the measured deposition rates were about four times those obtained in the absence of the higher temperature gas-phased prereactor. In this case, also, a much improved wafer-to-wafer thickness uniformity was observed.

Example 2

In this example, the reactors were configured exactly as in the first example. However, the prereactor temperature was fixed at 550° C., while the deposition reactor temperature was maintained at 450° C. Two different experiments were performed, aimed at determining whether an increased $SiO_2$ deposition rate might be obtained by increasing the residence time and concentration of the DADBS precursor within the gas-phase prereactor. In the first experiment, the pressure within the deposition reactor was maintained at 1000 mtorr, and the DADBS and $N_2$ flow rates were controlled at 32 sccm and 22 sccm, respectively. In the second test, a 1500 mtorr deposition reactor pressure was employed, along with DADBS and $N_2$ gas delivery rates of 14 sccm and 22 sccm, respectively.

The results of these two experiments are compared in Table II.

TABLE II

Rate of $SiO_2$ Deposition from DADBS at 450° C.
With a 550° C. Prereactor Temperature Prereactor Conditions TABLE II-continued Rate of SiO₂ Deposition from DADBS at 450° C.
With a 550° C. Prereactor Temperature

| Res. Time (sec) | DADBS Conc. (mole/l) |
|---|---|
| 0.24 | $1.9 \times 10^{-5}$ |
| 0.84 | $2.9 \times 10^{-5}$ |

Reactor Conditions

| DADBS Velocity (cm/sec) | DADBS Conc. (mole/l) |
|---|---|
| 27 | $1.3 \times 10^{-5}$ |
| 12 | $1.3 \times 10^{-5}$ |

Deposition Results
Dep. Rate on three Mid Substrates (Å/min)

| Center −1 | Center | Center +1 |
|---|---|---|
| 48.1 | 49.1 | 49.4 |
| 94.6 | 90.4 | 87.3 |

Listed are the approximate residence times and concentrations of DADBS within the 550° prereactor (calculated assuming uniform pressures within both reactors), the nominal gas velocities and precursor concentrations within the 450° deposition reactor (calculated assuming a relatively small fraction of the incoming DADBS converted to DADBS* within the prereactor), and the SiO₂ deposition rates obtained with the three middle silicon-wafer substrates. As can be seen in the table, deposition rates of approximately 50 Å per minute (with excellent wafer-to-wafer uniformity) were obtained in the first of the two experiments where the approximate DADBS prereactor residence time and concentration values were 0.24 sec and $1.9 \times 10^{-5}$ mole/l, respectively. In contrast, deposition rates approaching 100 Å/min were observed when the approximate DADBS prereactor residence time and concentration values were increased to 0.84 sec and $2.9 \times 10^5$ mole/l, respectively. The results, showing a decreasing deposition rate for the downstream substrates, presumably reflect a significant depletion of DADBS* within the deposition reactor resulting from the relatively low gas velocity (12 cm/sec versus the 27 cm/sec velocity employed in the first of the two experiments).

Example 3

In this example, the reactor configuration was essentially that diagramed in FIG. 6 with the gas-phase prereactor and thin-film deposition reactor integrated within the same tubular quartz envelope. The prereactor itself was a 6 inch length of 3 inch diameter double-walled quartz tubing with an embedded nichrome heating element. Two series of experiments were performed in which the silicon wafer deposition substrates were maintained at a constant 450° C. temperature while the gas-phase prereactor temperature was increased in steps from 450° to 550° C. In the first series of tests, the system pressure was fixed at 1000 mtorr, while the DADBS and N₂ vapor delivery rates were controlled at 14 sccm and 40 sccm, respectively (resulting in an approximate 30 cm/sec gas velocity through the deposition reactor). In the second series of tests, the system pressure was controlled at 2000 mtorr, while the DADBS and N₂ vapor delivery rates were adjusted to 7 sccm and 50 sccm respectively (yielding an approximate 15 cm/sec gas velocity through the deposition reactor). In each case, however, the nominal DADBS concentration within the deposition reactor was approximately $5.5 \times 10^6$ mole/l.

Figure 7:
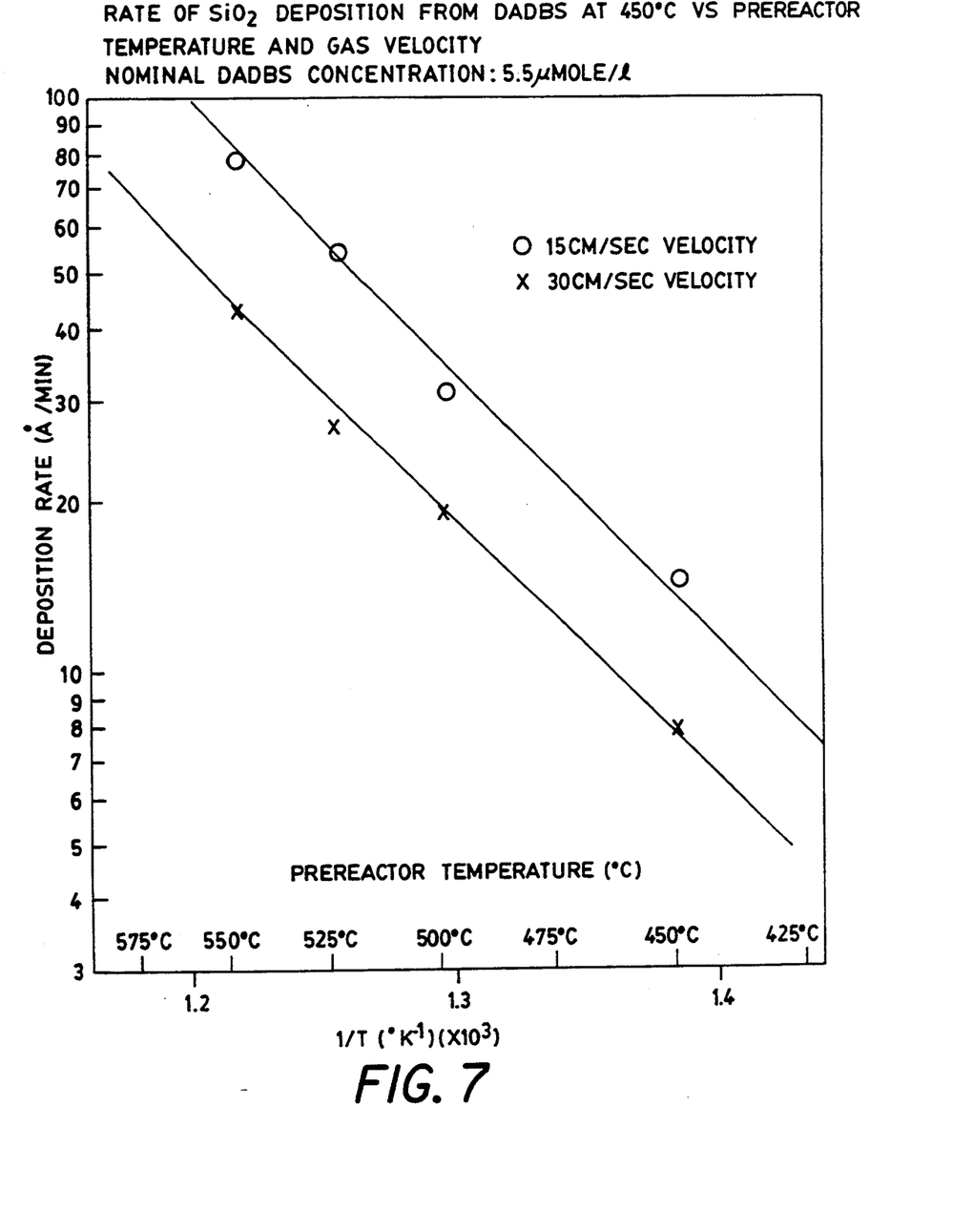
FIG. 7 is an Arrhenius plot of the SiO$_2$ deposition rate versus reciprocal of the prereactor temperature.

FIG. 7 contains a so-called Arrhenius plot (similar to that in FIG. 1) in which the log of the SiO₂ deposition rate is plotted versus reciprocal temperature. However, whereas in FIG. 1 the temperatures are those of the thin-film deposition reactor itself (in the absence of a gas-phase prereactor), in FIG. 7 it is the prereactor temperatures that are plotted (with the downstream thin-film deposition being carried out at a constant 450° C.). The two sets of data correspond to the two sets of experiments in which the gas velocity was maintained at about 15 cm/sec and about 30 cm/sec, respectively.

As shown in FIG. 7, for both gas velocities, the measured SiO₂ deposition rate at 450° C. increased by more than a factor of five as the temperature of the gas-phase DADBS prereactor was increased from 450° C. to 550° C. Further, on average, the deposition rate measured with a 15 cm/sec gas velocity was about 80% greater than that measured with a 30 cm/sec gas velocity. Finally, for both sets of data, the apparent activation energy (for the gas-phase activation process) is on the order of 20 kcal/mole, a value that is less than half of that observed for the deposition process in the absence of the prereactor as seen in FIG. 1. Even higher 450° C. deposition rates could likely be obtained by increasing the DADBS concentration within the reactor, by further increasing the temperature of the DADBS prereactor, by further decreasing the gas velocity within the reactor, or by a combination of these.

Example 4

In this example, the reactors were configured exactly as they were in Example 3. However, the prereactor temperature was fixed at 550° C., while the deposition reactor temperature ranged between 435° C. and 550° C. In each test, the system pressure was controlled at 2000 mtorr, while the DADBS and N₂ vapor delivery rates were fixed at 7 sccm and 50 sccm, respectively. The resulting nominal DADBS concentration was about $5.3 \times 10^{-6}$ mole/l, and the gas velocity through the deposition reactor was approximately 15 cm/sec.

Figure 8:
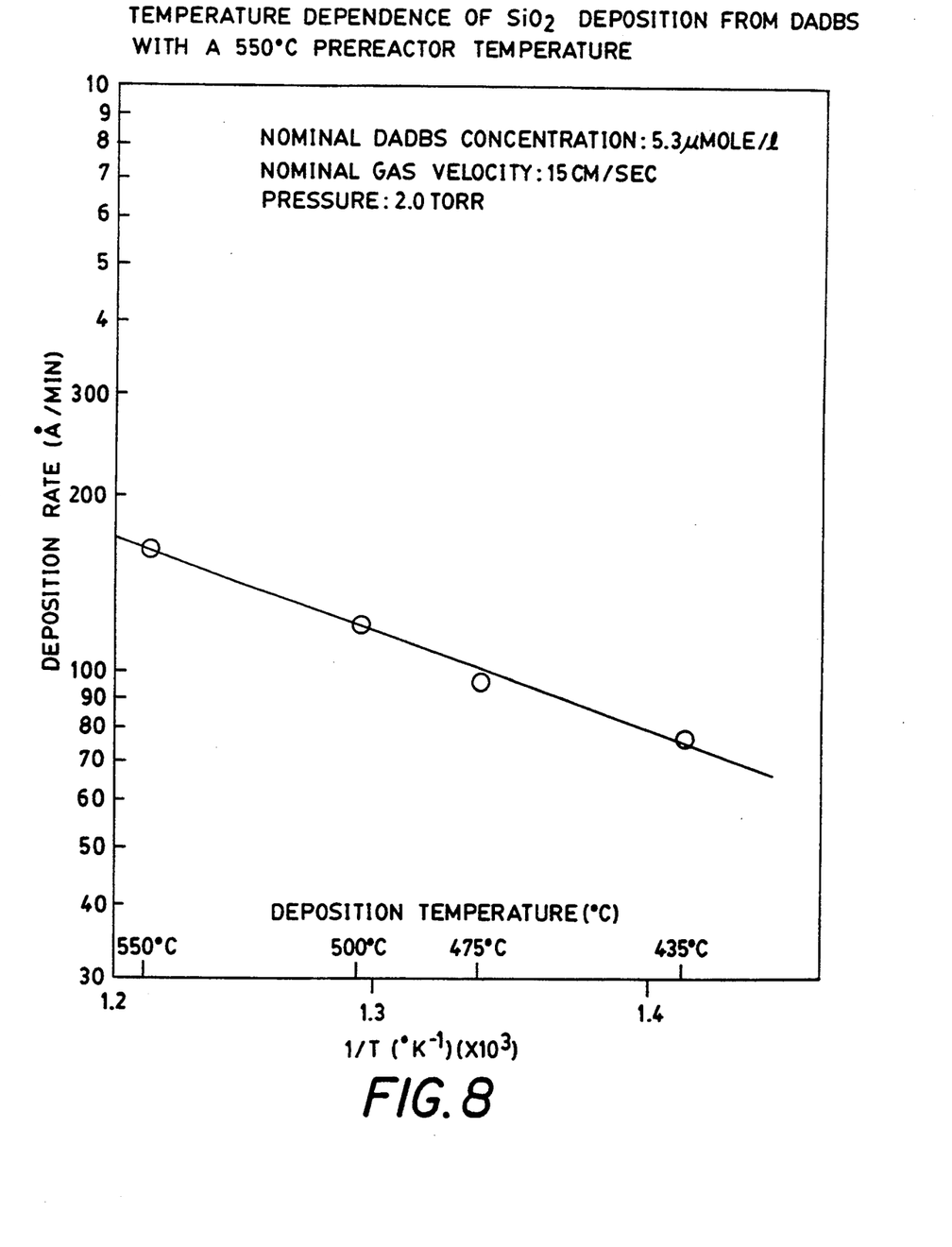
FIG. 8 is a plot of the log deposition rate versus reciprocal temperature for SiO$_2$ deposition from DADBS.

FIG. 8 contains the log deposition rate versus reciprocal temperature plot determined by the data points generated in this series of tests. However, unlike FIG. 7, in which the temperatures plotted are those of the gas-phase prereactor (with a constant thin-film deposition temperature), in FIG. 8 it is the deposition reactor temperatures that are plotted (with the prereactor temperature being held at a constant 550° C.). The apparent activation energy (presumably corresponding to the formation of SiO₂ from absorbed DABS*) is only about 7.5 kcal/mole, less than one-fifth of that observed for the deposition process in the absence of the gas-phase prereactor as in FIG. 1. These data, considered together with the results described in Example 3, demonstrate that the rate of SiO₂ deposition is relatively insensitive to temperature non-uniformities or fluctuations in either the prereactor or the thin-film deposition reactor. This is believed to result from the splitting of the overall reaction into two parts; an activation reaction, and a deposition reaction. Thus, the use of an upstream prereactor to transform the SiO₂ deposition precursor into a more reactive molecule (i.e., DADBS→DADBS*) apparently makes the overall deposition rate much less sensitive to the temperature of either of the series-connected reactors than it is to the temperature of the deposition reactor in the absence of the gas-phase prereactor.

Equivalents

Although specific features of the invention are included in some embodiments and drawings and not others, it should be noted that each feature may be combined with any or all of the other features in accordance with the invention.

It should be understood, that the foregoing description of the invention is intended merely to be illustrative thereof, the illustrative embodiments are presented by way of example only, and that other modifications, embodiments, and equivalents may be apparent to those skilled in the art without departing from its spirit.

Having thus described the invention, what I desire to claim and secure by Letters Patent is:

1. A method for the deposition of $SiO_2$ onto a substrate which comprises the steps of:

a) providing a feed stream comprising gas-phase DADBS to a first reactor;

b) heating the feed stream in said first reactor to a first temperature between about 450° C. and 550° C. to allow the formation of activated DADBS and for a time sufficient to form a mixture of activated DADBS and unactivated DADBS; and c) contacting the mixture with a substrate in a second reactor while maintaining the substrate and the mixture in said second reactor at a second temperature between about 400° C. to 450° C., said second temperature 50° C. lower than said first temperature, for a time sufficient to allow $SiO_2$ to deposit from the mixture onto the substrate, said first and said second reactors being separate and interconnected.

* * * * *